(12) United States Patent
Jou et al.

(10) Patent No.: US 10,157,876 B2
(45) Date of Patent: Dec. 18, 2018

(54) METHOD OF FORMING INDUCTOR WITH CONDUCTIVE TRACE

(71) Applicant: Taiwan Semiconductor Manufacturing Company Limited, Hsin-Chu (TW)

(72) Inventors: Chewn-Pu Jou, Hsinchu (TW); Wen-Shiango Liao, Toufen Township (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/840,410

(22) Filed: Aug. 31, 2015

(65) Prior Publication Data

US 2015/0371772 A1   Dec. 24, 2015

Related U.S. Application Data

(63) Continuation-in-part of application No. 13/655,695, filed on Oct. 19, 2012.

(51) Int. Cl.
| | |
|---|---|
| *H01L 25/00* | (2006.01) |
| *H01L 23/00* | (2006.01) |
| *H01F 17/00* | (2006.01) |
| *H01F 41/04* | (2006.01) |
| *H01L 23/64* | (2006.01) |
| *H01L 25/16* | (2006.01) |
| *H01L 23/31* | (2006.01) |

(52) U.S. Cl.
CPC ......... *H01L 24/19* (2013.01); *H01F 17/0033* (2013.01); *H01F 41/046* (2013.01); *H01L 23/645* (2013.01); *H01L 25/16* (2013.01); *H01L 23/3128* (2013.01); *H01L 2224/12105* (2013.01); *H01L 2224/24195* (2013.01); *H01L 2924/14* (2013.01); *H01L 2924/19042* (2013.01); *H01L 2924/19105* (2013.01); *H01L 2924/30107* (2013.01); *Y10T 29/4902* (2015.01)

(58) Field of Classification Search
CPC ... H01L 24/19; H01L 23/645; H01L 23/3128; H01L 25/16; H01L 2224/12105; H01L 2224/24195; H01L 2924/14; H01L 2924/19042; H01L 2924/18105; H01L 2924/30107
USPC .......................................... 427/58, 97.2, 97.7
See application file for complete search history.

(56) References Cited

U.S. PATENT DOCUMENTS 5,861,647 A * 1/1999 Zhao .................... H01L 23/5223
257/296
6,657,298 B1 * 12/2003 Glenn .................... H01L 21/565
257/666

(Continued)

OTHER PUBLICATIONS

"Inductor", Retrieved on Sep. 7, 2012, pp. 1-16, http://en.wikipedia.org/wiki/Inductor.

*Primary Examiner* — Brian K Talbot
(74) *Attorney, Agent, or Firm* — Cooper Legal Group, LLC

(57) ABSTRACT

Among other things, a method for forming an inductor is provided. The method includes forming an insulating layer on a carrier. The method includes forming a trench in the insulating layer. The method also includes forming a magnetic structure within the trench. The method includes forming a conductive trace around the magnetic structure to form the inductor.

20 Claims, 12 Drawing Sheets

(56) References Cited

U.S. PATENT DOCUMENTS

| | | | |
|---|---|---|---|
| 6,756,875 B2* | 6/2004 | Ahn | H01F 5/003 336/200 |
| 8,072,042 B1* | 12/2011 | Kroener | H01F 41/046 257/531 |
| 2003/0137385 A1* | 7/2003 | Ahn | H01F 5/003 336/200 |
| 2005/0282347 A1* | 12/2005 | Davies | H01L 21/764 438/329 |
| 2009/0051025 A1 | 2/2009 | Yang et al. | |
| 2009/0166804 A1* | 7/2009 | Gardner | H01L 23/5227 257/531 |
| 2014/0104288 A1* | 4/2014 | Shenoy | G09G 5/00 345/531 |

* cited by examiner

METHOD OF FORMING INDUCTOR WITH CONDUCTIVE TRACE

CROSS-REFERENCE TO RELATED APPLICATIONS

This application is a continuation of and claims benefit to U.S. patent application Ser. No. 13/655,695, filed on Oct. 19, 2012 and titled "INDUCTOR WITH CONDUCTIVE TRACE," the entire disclosure of which is hereby incorporated by reference.

BACKGROUND

Inductors can be used for various applications, such as filters in circuits, energy storage components, reactors to depress voltage, switching current limiters, transformers, etc. In an example, a transformer can be formed from a first inductor and a second inductor. The transformer can transfer electrical energy from a first circuit to a second circuit using magnetic flux generated between the first inductor and the second inductor.

DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
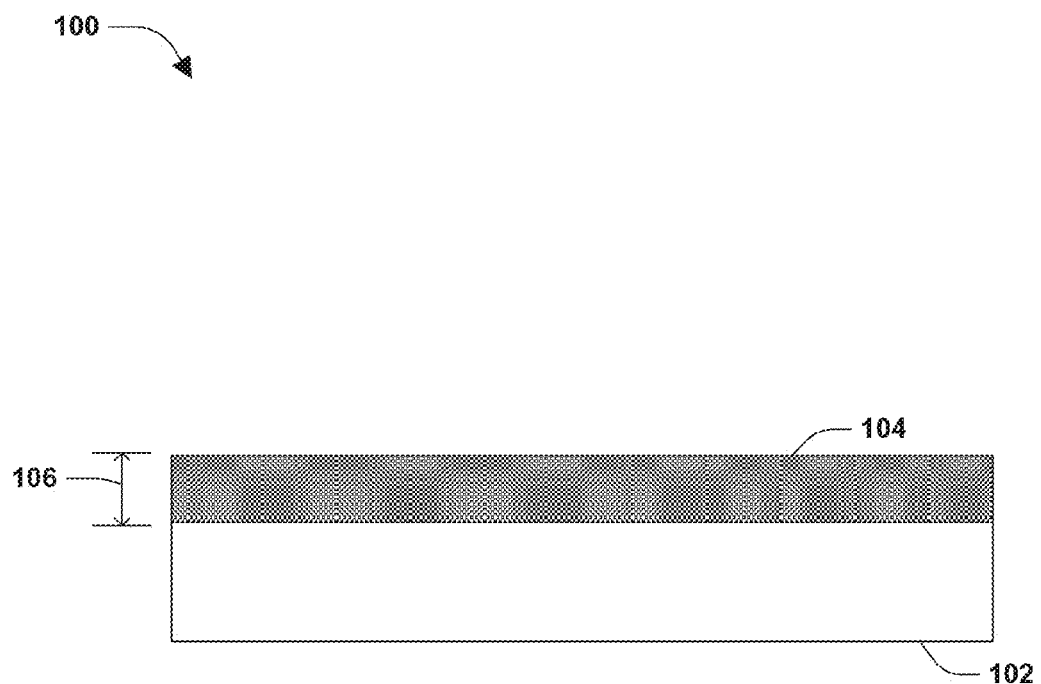
FIG. 1 illustrates a portion of a semiconductor device, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a sectional view illustrating a portion of a semiconductor device, according to some embodiments. In some embodiments, the semiconductor device comprises an inductor 100, and at least some of the semiconductor device is initially formed on a first carrier 102. The carrier 102 comprises a temporary material during processing, such as silicon, silicon dioxide (glass), ceramic, polymer, etc.

According to some embodiments, an insulating layer 104 is formed on the carrier 102. In some embodiments, the insulating layer 104 comprises a dielectric material. In some embodiments, the insulating layer 104 comprises glass, a spin-on glass (SOG), a silicon based material such as silicon dioxide ($SiO_2$), a ceramic, low temperature co-fired ceramic (LTCC), a polymer based material, etc. According to some embodiments, the insulating layer 104 is formed using a spin-on process, a deposition process, an injection process, a growth process, a sputtering process, etc. According to some embodiments, the insulating layer 104 has a first insulator thickness 106 that is between about 10 μm to about 9000 μm.

Figure 2A:
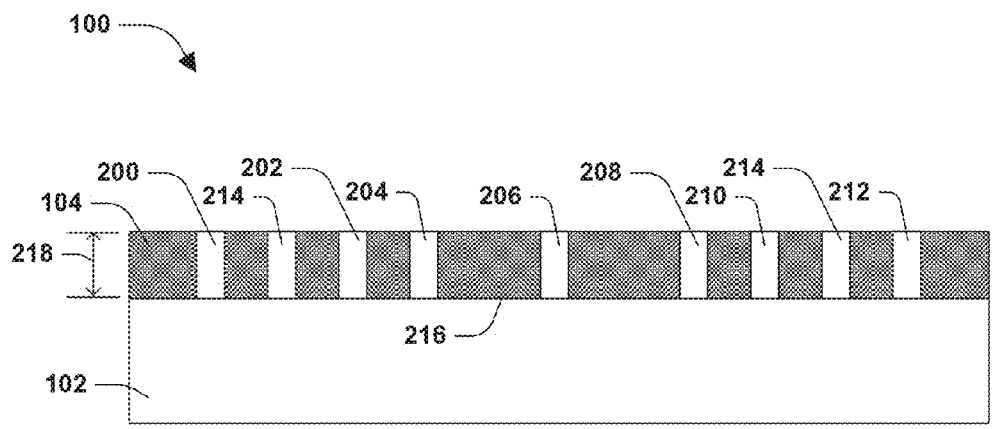
FIG. 2A illustrates forming one or more openings and a trench, according to some embodiments.
Figure 2B:
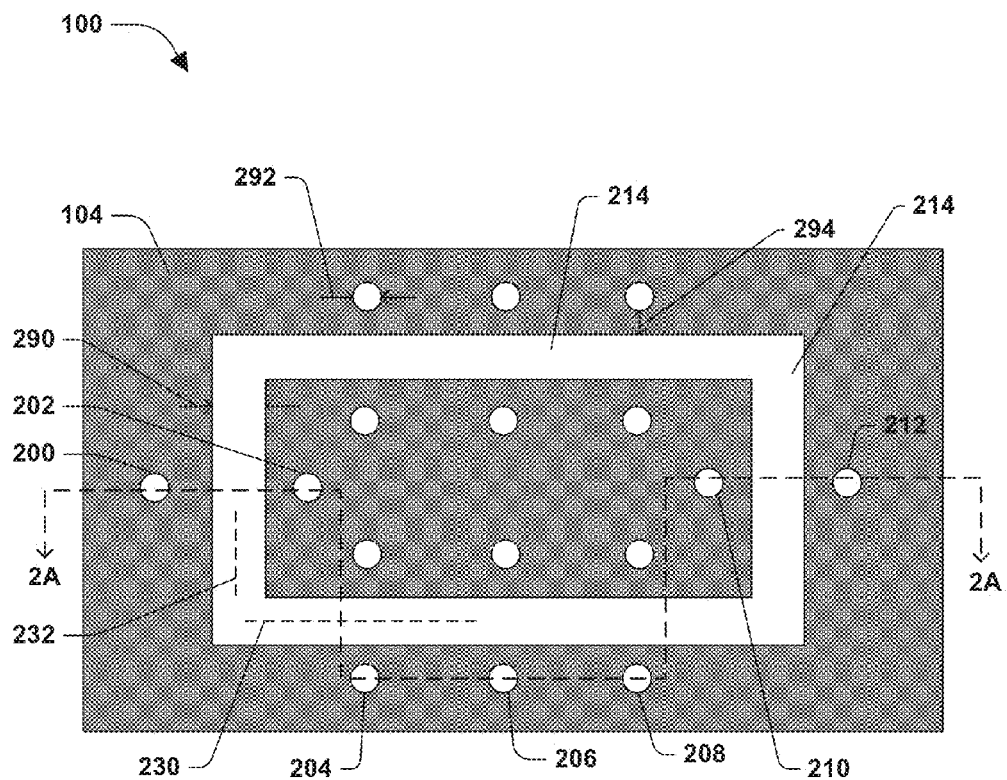
FIG. 2B illustrates forming one or more openings and a trench, according to some embodiments.

FIG. 2A is a sectional view looking into the embodiment of FIG. 2B from a perspective indicated by line 2A-2A. According to some embodiments, some of the insulating layer 104 is removed to form a trench 214 and one or more openings, such as a first opening 200, a second opening 202, a third opening 204, a fourth opening 206, a fifth opening 208, a sixth opening 210, a seventh opening 212, etc., in the insulating layer 104.

According to some embodiments, the insulating layer 104 is patterned using photolithography, dry etching, wet etching, plasma etching, etc. to form at least one of the one or more openings or the trench 214. In some embodiments, an etch chemistry comprising fluorine, chlorine, hydrogen bromide, boron trichloride, argon, etc., is used to pattern the insulating layer 104. According to some embodiments, the trench 214 is formed concurrently with the formation of one or more of the one or more openings. According to some embodiments, the trench 214 is not formed concurrently with the formation of one or more of the one or more openings.

According to some embodiments, the one or more openings and the trench 214 are formed through the insulating layer 104 to an upper edge or top surface 216 of the carrier 102. According to some embodiments, at least one of before, during, or after the formation of the one or more openings and the trench 214 in the insulating layer 104, an upper surface of the insulating layer 104 is planarized, such as by chemical mechanical planarization (CMP). In some embodiments, following this chemical mechanical planarization, the insulating layer 104 has a second insulator thickness 218 that is between about 100 µm to about 800 µm. According to some embodiments, at least one of the one or more openings or the trench 214 has depths corresponding to a thickness of the insulating layer 104.

Turning to FIG. 2B, in some embodiments, the trench 214 is formed along a first axis 230 and a second axis 232. According to some embodiments, the first axis 230 is not parallel to the second axis 232. In some embodiments, the first axis 230 forms an angle with respect to the second axis 232 that is between about 30 degrees to about 150 degrees. In some embodiments, the first axis 230 forms an angle with respect to the second axis 232 that is between about 90 degrees to about 180 degrees. In some embodiments, at least some of the trench 214 extends non-linearly within the insulating layer 104. According to some embodiments, the trench 214 forms a closed loop, or other closed shape. In some embodiments, a closed shape does not have ends. In some embodiments, the trench 214 comprises a closed polygonal shape that is elongated and rectangular. According to some embodiment, the trench 214 has at least one of any number of sides or any numbers of curvatures.

According to some embodiments, the trench 214 has a trench width 290 that is between about 10 µm to about 100 µm. According to some embodiments, at least some of the one or more openings respectively have an opening width 292 that is between about 5 µm to about 50 µm. According to some embodiments, at least some of the one or more openings have a circular cross sectional shape, as illustrated in FIG. 2B, such that the opening width 292 corresponds to a diameter. According to some embodiments, at least some of the one or more of the openings respectively have a cross-sectional area that is between about 5 µm to about 50 µm. According to some embodiments, a separating distance 294 that separates the trench 214 from at least some of the one or more openings is between about 5 µm to about 50 µm.

Figure 3:
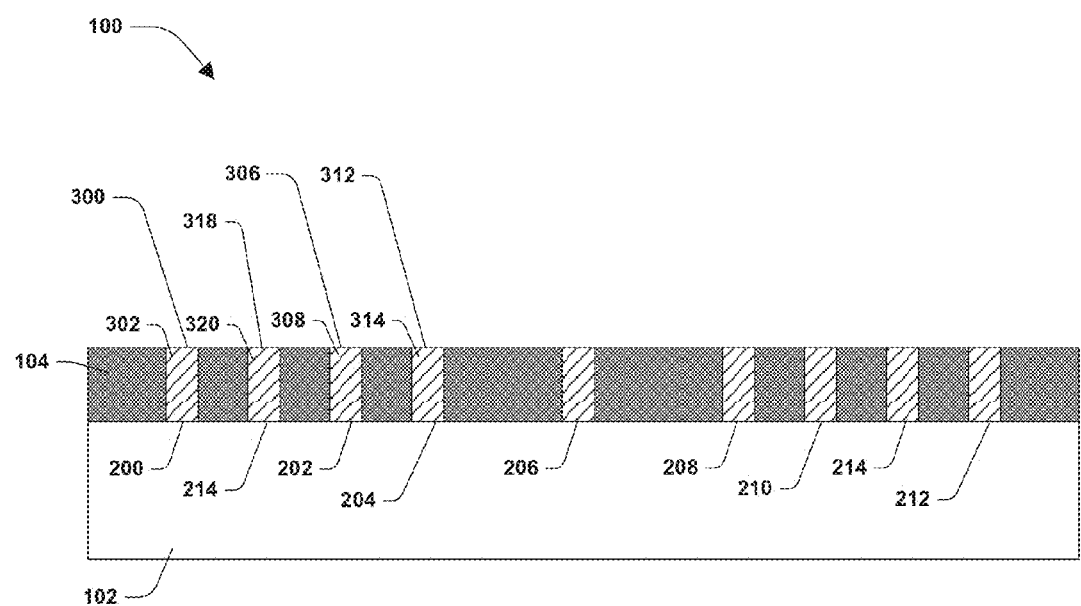
FIG. 3 illustrates forming one or more filler structures and a trench filler structure, according to some embodiments.

Turning to FIG. 3, in some embodiments, respective filler structures are formed within the one or more openings and a trench filler structure 318 is formed within the trench 214. According to some embodiments, a first filler structure 300 is formed by filling the first opening 200 with a first filler material 302, a second filler structure 306 is formed by filling the second opening 202 with a second filler material 308, a third filler structure 312 is formed by filling the third opening 204 with a third filler material 314, etc. According to some embodiments, the trench filler structure 318 is formed by filling the trench 214 with a trench filler material 320.

According to some embodiments, the same filler material is used to form the respective filler structures and the trench filler structure. In some embodiments, different filler materials are used to form the respective filler structures and the trench filler structure. In some embodiments, the filler material used to form at least one of the respective filler structures or the trench filler structure comprises at least one of a dielectric material or a polymer based material. According to some embodiments, at least one of the respective filler structures or the trench filler structure are formed using a spin-on process, a deposition process, an injection process, a growth process, a sputtering process, etc. According to some embodiments, the respective filler structures and the trench filler structure are formed concurrently with one another.

Figure 4A:
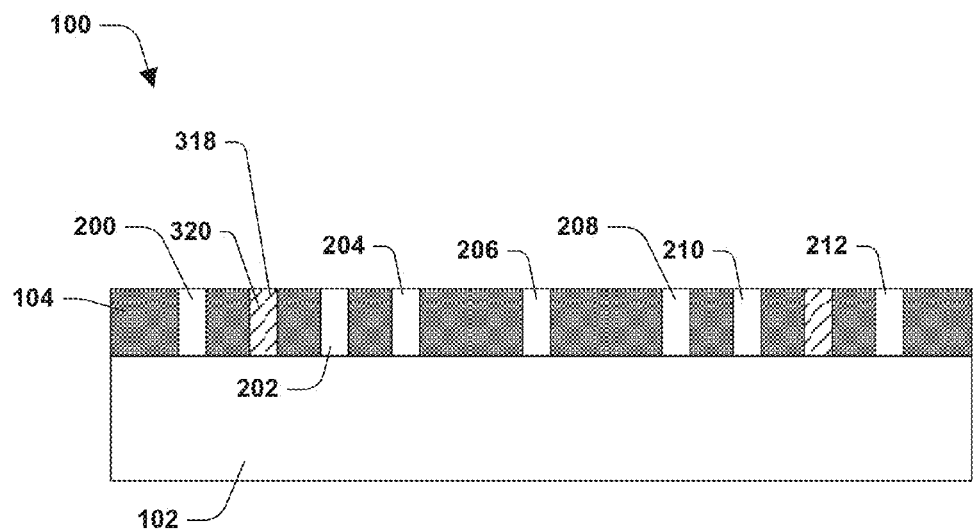
FIG. 4A illustrates removing one or more filler structures, according to some embodiments.
Figure 4B:
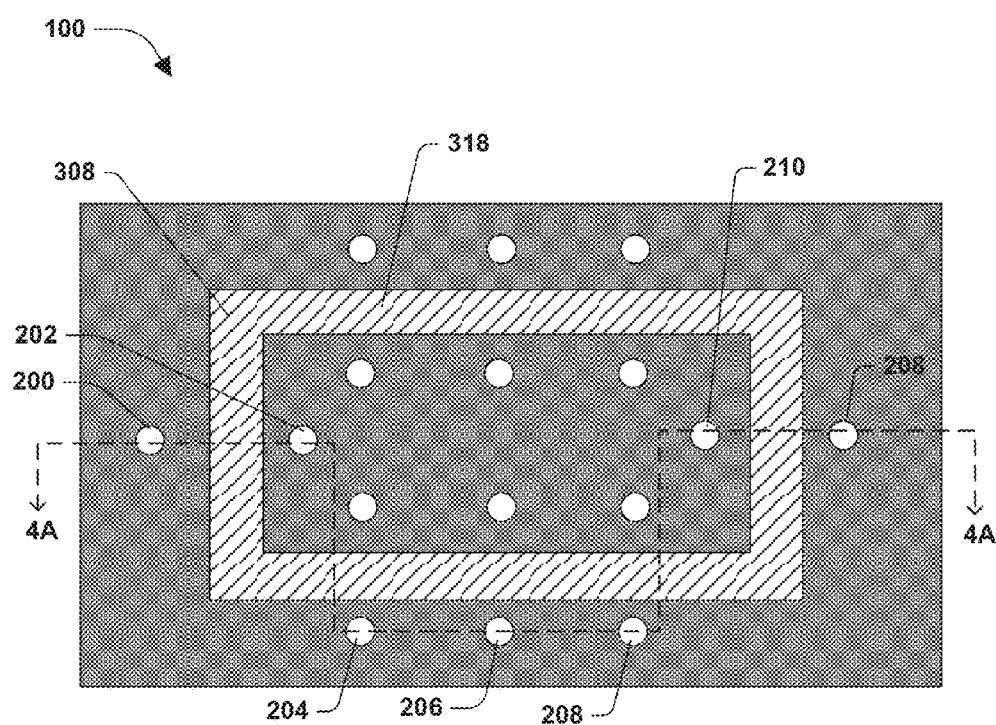
FIG. 4B illustrates removing one or more filler structures, according to some embodiments.

Turning to FIGS. 4A and 4B, according to some embodiments, at least some of the filler structures 300, 306, 312, etc. are removed from the one or more openings while the trench filler structure 318 is not removed from the trench 214. According to some embodiments, the filler structures 300, 306, 312, etc. are removed using photolithography, wet etching, dry etching, plasma etching, etc. According to some embodiments, the filler structures 300, 306, 312, etc. are removed concurrently.

Figure 5:
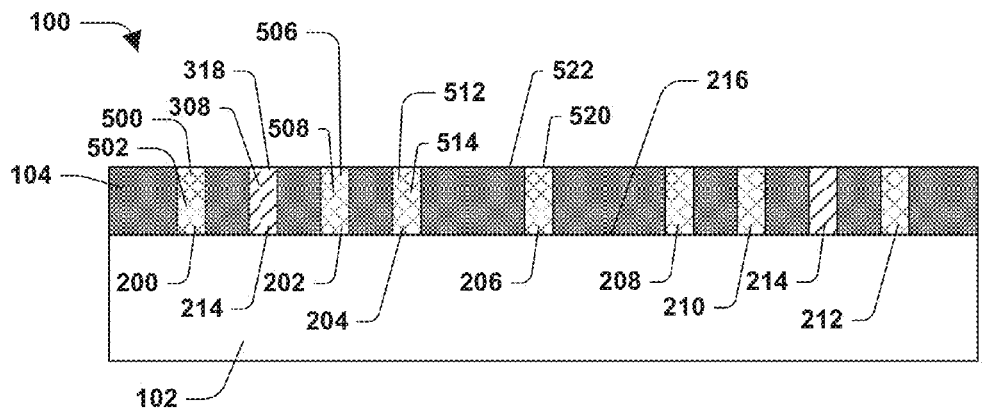
FIG. 5 illustrates forming one or more conductive pillars, according to some embodiments.

Turning to FIG. 5, according to some embodiments, one or more conductive pillars are respectively formed by filling the one or more openings with a conductive material. According to some embodiments, at least some of the one or more conductive pillars comprise copper. According to some embodiments, a first conductive pillar 500 is formed by filling the first opening 200 with a first conductive material 502, a second conductive pillar 506 is formed by filling the second opening 202 with a second conductive material 508, a third conductive pillar 512 is formed by filling the third opening 204 with a third conductive material 514, etc. According to some embodiments, the same conductive material is used to form the respective conductive pillars.

According to some embodiments, the one or more conductive pillars are formed using a spin-on process, a deposition process, an injection process, a growth process, a sputtering process, etc. According to some embodiments, to form a conductive pillar within an opening, a seed layer is formed within the opening, such as onto the top surface 216 of the carrier 102, followed by electrochemical plating (ECP) the conductive material into the opening on top of the seed layer. According to some embodiments, the conductive pillars 500, 506, 512, etc. are formed concurrently. According to some embodiments, chemical mechanical planarization (CMP) is performed after the conductive pillars are formed such that an upper conductive surface 520 of the conductive pillars 500, 506, 512, etc. is substantially coplanar with an upper insulating surface 522 of the insulating layer 104.

Figure 6:
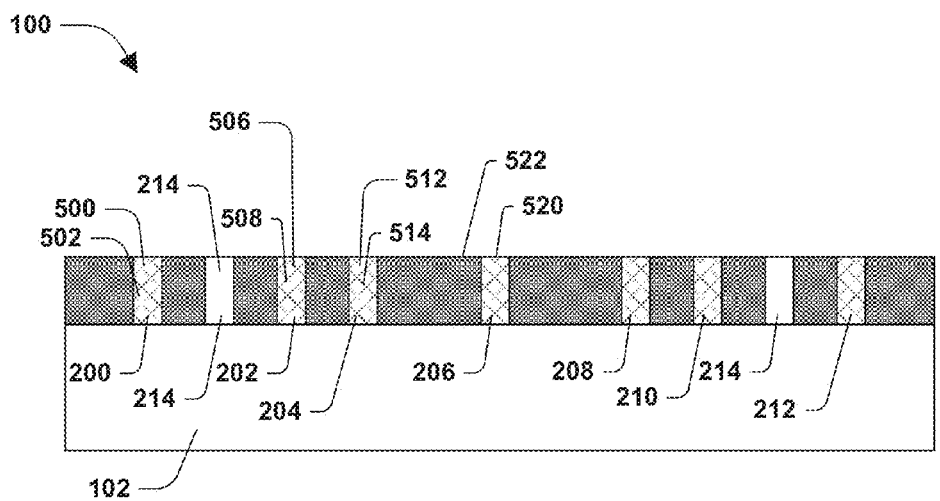
FIG. 6 illustrates removing a trench tiller structure, according to some embodiments.

Turning to FIG. 6, according to some embodiments, the trench filler structure 318 is removed from the trench 214 while the conductive pillars 500, 506, 512, etc. are not removed from the one or more openings. According to some embodiments, the trench filler structure 318 is removed using photolithography, wet etching, dry etching, plasma etching, etc.

Figure 7:
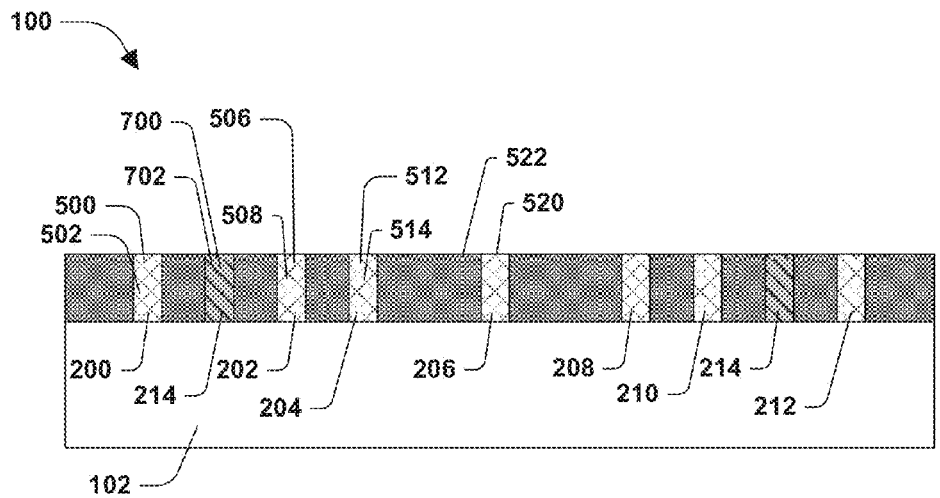
FIG. 7 illustrates forming a magnetic structure, according to some embodiments.

Turning to FIG. 7, according to some embodiments, a magnetic structure 700 is formed by filling the trench 214 with a magnetic material 702. According to some embodiments, the magnetic material 702 comprises a high permeability magnetic material having a magnetic permeability constant ($\mu_r$), such as about $\mu_r$>1000 henries per meter.

According to some embodiments, the magnetic structure 700 is formed using a spin-on process, a deposition process, an injection process, a growth process, a sputtering process, etc. According to some embodiments, a spin-coating combination of about 30% to about 50% nickel, about 30% to about 50% zinc, about 10% to about 30% copper, and about 5% to about 25% $Fe_2O_4$ is used to form the magnetic structure 700. According to another embodiment, a spin-coating combination of about 70% to about 90% yttrium, about 10% to about 30% bismuth, and about 0.5% to about 1.5% $Fe_5O_{12}$ is used to form the magnetic structure 700.

According to some embodiments, an electroplating deposition combination of about 70% to about 90% nickel and about 10% to about 30% iron is used to form the magnetic structure 700. According to some embodiments, a sputtering combination of about 75% to about 85% nickel and about 15% to about 25% of iron is used to form the magnetic structure 700. According to some embodiments, a sputtering combination of about 85% to about 95% cobalt, about 2.5% to about 7.5% tantalum, and about 2.5% to about 7.5% zirconium is used to form the magnetic structure 700.

Figure 8:
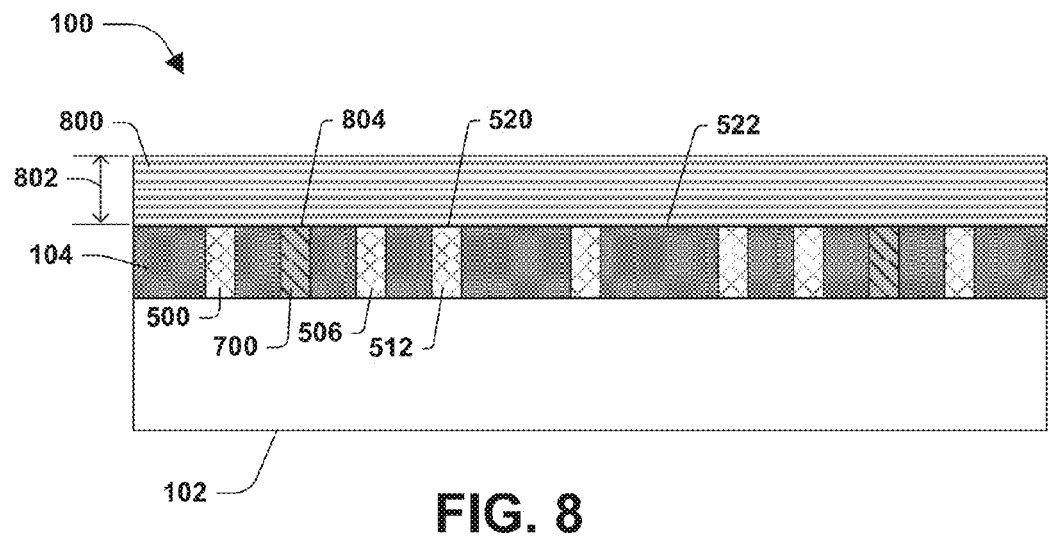
FIG. 8 illustrates forming an upper insulating layer, according to some embodiments.

Turning to FIG. 8, according to some embodiments, an upper insulating layer 800 is formed above the insulating layer 104, the magnetic structure 700, and the one or more the conductive pillars 500, 506, 512, etc. In some embodiments, the upper insulating layer 800 comprises a dielectric material. According to some embodiments, the upper insulating layer 800 comprises a polymer comprising at least one of polybenzoxazole (PBO) or one or more other materials. According to some embodiments, the upper insulating layer 800 is formed using a spin-on process, a deposition process, an injection process, a growth process, a sputtering process, etc. In some embodiments, the upper insulating layer 800 has an upper insulating thickness 802 that is between about 2 µm to about 50 µm. In some embodiments, the upper insulating layer 800 is formed on an upper conductive surface 520 of the conductive pillars 500, 506, 512, etc., the upper insulating surface 522 of the insulating layer 104, and an upper magnetic surface 804 of the magnetic structure 700.

Figure 9:
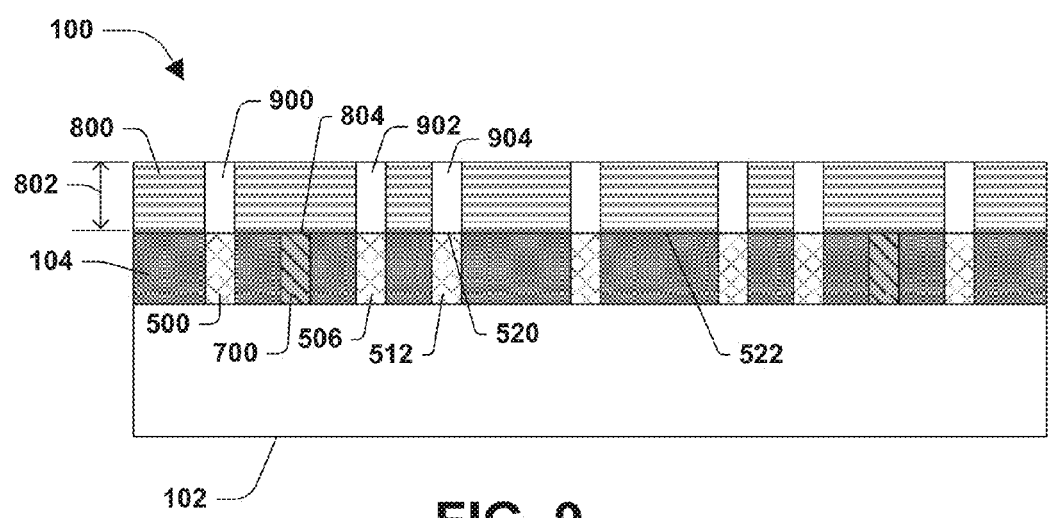
FIG. 9 illustrates forming one or more upper insulating openings, according to some embodiments.

Turning to FIG. 9, according to some embodiments, one or more upper insulating openings are respectively formed through the upper insulating layer 800 to expose the conductive pillars 500, 506, 512, etc. In some embodiments, a first upper insulating opening 900 is formed in the upper insulating layer 800 to expose the first conductive pillar 500, a second upper insulating opening 902 is formed in the upper insulating layer 800 to expose the second conductive pillar 506, a third upper insulating opening 904 is formed in the upper insulating layer 800 to expose the third conductive pillar 512, etc. According to some embodiments, the upper insulating openings 900, 902, 904, etc. are formed concurrently. According to some embodiments, an upper insulating opening is not formed above the magnetic structure 700 such that magnetic structure 700 is not exposed through the upper insulating layer 800, but rather remains covered by the upper insulating layer 800.

According to some embodiments, the one or more upper insulating openings 900, 902, 904, etc. are formed in the upper insulating layer 800 using photolithography, wet etching, dry etching, plasma etching, etc. In some embodiments, an etch chemistry for etching through the upper insulating layer 800 to form the upper insulating openings 900, 902, 904, etc. comprises chlorine, fluorine, hydrogen bromide, boron trichloride, argon, etc.

Figure 10A:
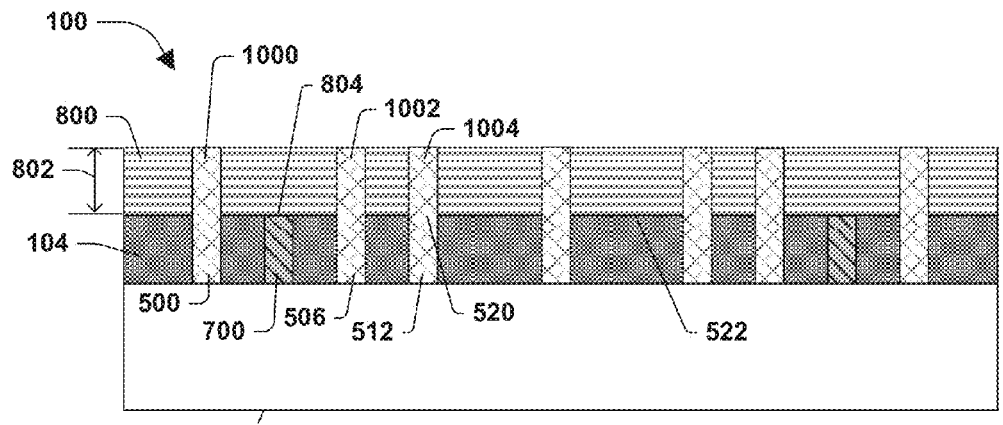
FIG. 10A illustrates further forming one or more conductive pillars, according to some embodiments.

Turning to FIG. 10A, according to some embodiments, the one or more of the conductive pillars are further formed by filling at least some of the one or more of the upper insulating openings 900, 902, 904, etc. with an upper conductive material. In some embodiments, the first conductive pillar 500 is formed by filling the first upper insulating opening 900 with a first upper conductive material 1000, the second conductive pillar 506 is formed by filling the second upper insulating opening 902 with a second upper conductive material 1002, the third conductive pillar 512 is formed by filling the third upper insulating opening 904 with a third upper conductive material 1004, etc.

According to some embodiments, the first upper conductive material 1000, the second upper conductive material 1002, the third upper conductive material 1004, etc. are applied using a spin-on process, a deposition process, an injection process, a growth process, a sputtering process, etc. In some embodiments, an electroplating process is used to fill the first upper conductive material 1000, the second upper conductive material 1002, the third upper conductive material 1004, etc. into the upper insulating openings 900, 902, 904, etc. According to some embodiments, a titanium seed layer is initially sputtered and applied into an upper insulating opening as part of the electroplating process. In some embodiments, at least some of the first upper conductive material 1000, the second upper conductive material 1002, the third upper conductive material 1004, etc. comprise copper. According to some embodiments, the first upper conductive material 1000, the second upper conductive material 1002, the third upper conductive material 1004, etc. are applied concurrently.

Figure 10B:
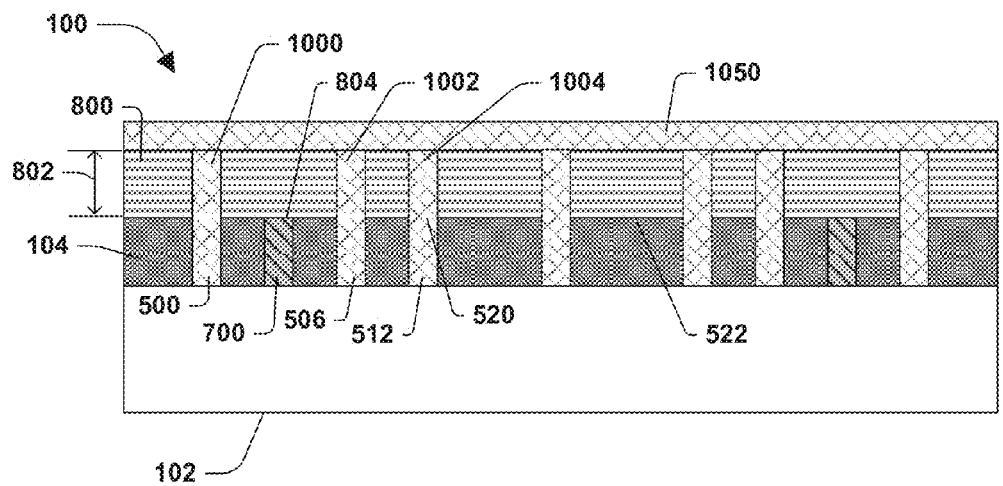
FIG. 10B illustrates forming a layer of an upper conductive material, according to some embodiments.

Turning to FIG. 10B, according to some embodiments, a layer 1050 of an upper conductive material is formed over the first conductive pillar 500, the second conductive pillar 506, the third conductive pillar 512, etc. and the upper insulating layer 800. According to some embodiments, the layer 1050 of the upper conductive material is formed using a spin-on process, a deposition process, an injection process, a growth process, a sputtering process, etc. In some embodiments, an electroplating process is used to form the layer 1050 of the upper conductive material. According to some embodiments, a titanium seed layer is initially applied as part of the electroplating process. In some embodiments, the layer 1050 of the upper conductive material comprises copper.

Figure 11A:
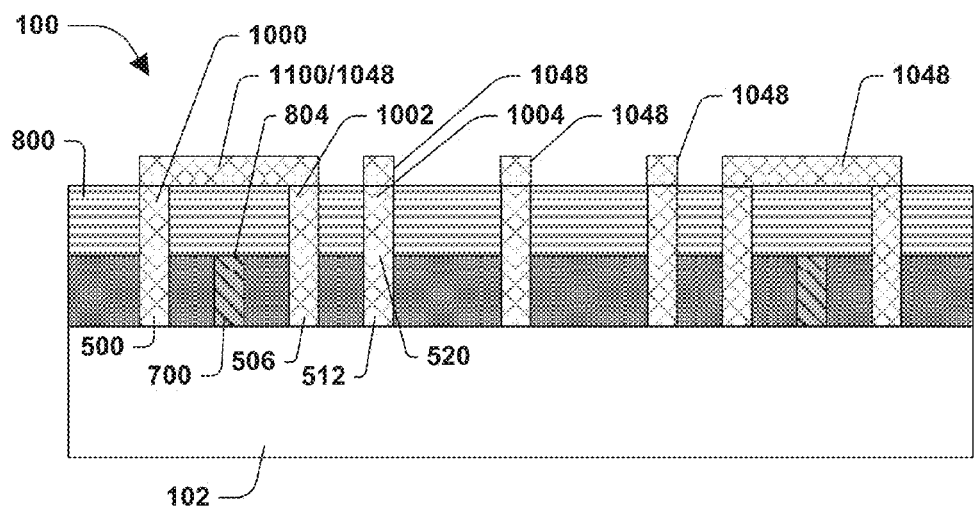
FIG. 11A illustrates forming one or more upper interconnects, according to some embodiments.
Figure 11B:
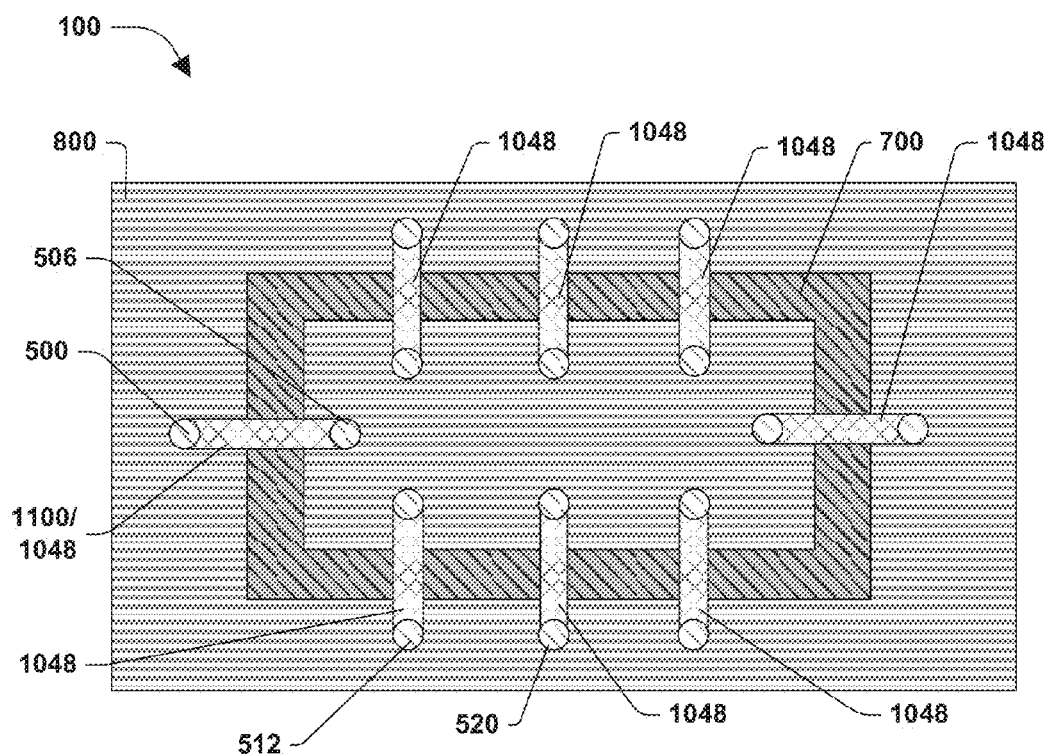
FIG. 11B illustrates forming one or more upper interconnects, according to some embodiments.

Turning to FIGS. 11A and 11B, according to some embodiments, the layer 1050 of the upper conductive material is patterned to form one or more upper interconnects 1048. In some embodiments, a first upper interconnect 1100 is formed above the magnetic structure 700. In some embodiments, the first upper interconnect 1100 connects the first conductive pillar 500 and the second conductive pillar 506, providing an electrically conductive pathway between the first conductive pillar 500 and the second conductive pillar 506. According to some embodiments, the layer 1050 of the upper conductive material is patterned using photolithography, dry etching, wet etching, plasma etching, etc. to form the upper interconnects 1048. According to some embodiments, the upper interconnects are formed concurrently.

Figure 12:
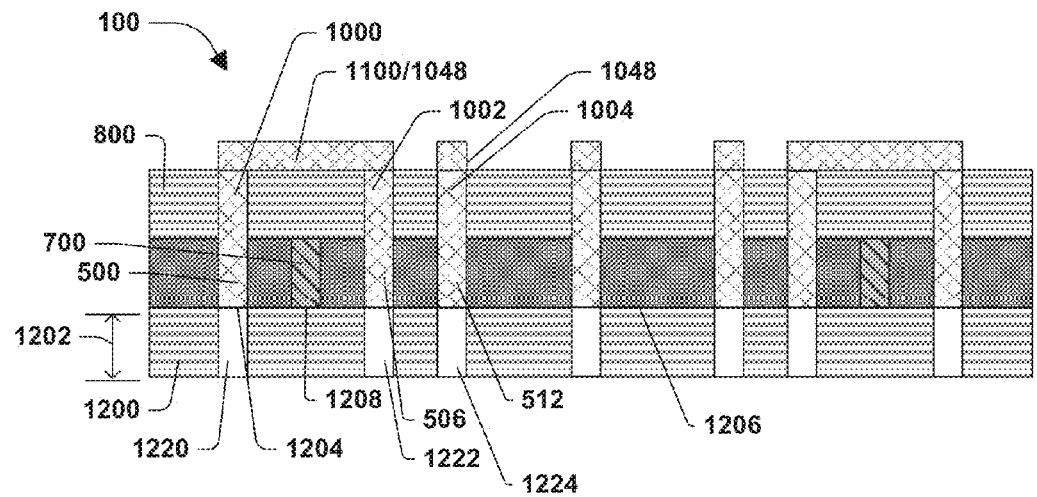
FIG. 12 illustrates forming a lower insulating layer and one or more lower insulating openings, according to some embodiments.

Turning to FIG. 12, according to some embodiments, the temporary carrier 102 is eventually removed from the lower side of the inductor 100. In some embodiments, subsequent to the removal of the carrier 102, a lower insulating layer 1200 is formed below the insulating layer 104, the magnetic structure 700, and the conductive pillars 500, 506, 512, etc. In some embodiments, the lower insulating layer 1200 comprises a dielectric material. According to some embodiments, the lower insulating layer 1200 comprises a polymer comprising at least one of polybenzoxazole materials. According to some embodiments, the lower insulating layer 1200 is formed using a spin-on process, a deposition process, an injection process, a growth process, a sputtering process, etc. In some embodiments, the lower insulating layer 1200 has a lower insulating thickness 1202 that is between about 2 μm to about 50 μm. In some embodiments, the lower insulating thickness 1202 is formed on a lower conduction surface 1204 of the conductive pillars 500, 506, 512, etc., a lower insulating surface 1206 of the insulating layer 104, and a lower magnetic surface 1208 of the magnetic structure 700.

According to some embodiments, one or more lower insulating openings are respectively formed within the lower insulating layer 1200 to expose the conductive pillars 500, 506, 512, etc. In some embodiments, a first lower insulating opening 1220 is formed in the lower insulating layer 1200 to expose the first conductive pillar 500, a second lower insulating opening 1222 is formed in the lower insulating layer 1200 to expose the second conductive pillar 506, a third lower insulating opening 1224 is formed in the lower insulating layer 1200 to expose the third conductive pillar 512, etc. According to some embodiments, the lower insulating openings 1220, 1222, 1224, etc. are formed concurrently. According to some embodiments, a lower insulating opening is not formed below the magnetic structure 700 such that the magnetic structure 700 is not exposed through the lower insulating layer 1200, but rather remains covered by the lower insulating layer 1200.

According to some embodiments, the one or more lower insulating openings 1220, 1222, 1224, etc. are formed in the lower insulating layer 1200 using photolithography, wet etching, dry etching, plasma etching, etc. In some embodiments, an etch chemistry for etching through the lower insulating layer 1200 to form the lower insulating openings 1220, 1222, 1224, etc. comprises fluorine, chlorine, hydrogen bromide, boron trichloride, argon, etc.

Figure 13:
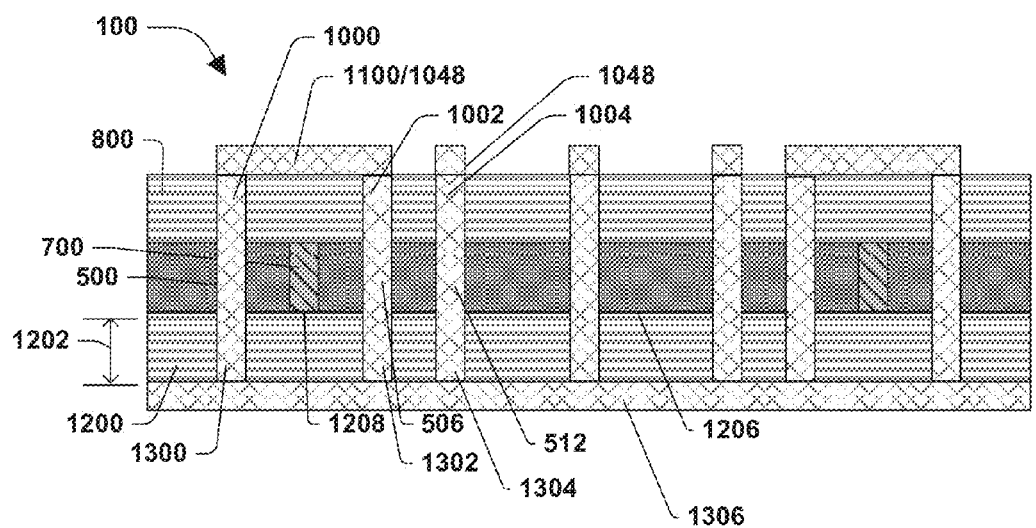
FIG. 13 illustrates further forming one or more conductive pillars and a layer of a lower conductive material, according to some embodiments.

Turning to FIG. 13, according to some embodiments, the one or more conductive pillars are further formed by filling at least some of the one or more lower insulating openings 1220, 1222, 1224, etc. with a lower conductive material. In some embodiments, the first conductive pillar 500 is formed by filling the first lower insulating opening 1220 with a first lower conductive material 1300, the second conductive pillar 506 is formed by filling the second lower insulating opening 1222 with a second lower conductive material 1302, the third conductive pillar 512 is formed by filling the third lower insulating opening 1224 with a third lower conductive material 1304, etc.

According to some embodiments, the first lower conductive material 1300, the second lower conductive material 1302, the third lower conductive material 1304, etc. are applied using a spin-on process, a deposition process, an injection process, a growth process, a sputtering process, etc. In some embodiments, an electroplating process is used to fill the first lower conductive material 1300, the second lower conductive material 1302, the third lower conductive material 1304, etc. into the lower insulating openings 1220, 1222, 1224, etc. According to some embodiments, a titanium seed layer is initially placed into a lower insulating opening as part of the electroplating process. In some embodiments, at least some of the first lower conductive material 1300, the second lower conductive material 1302, the third lower conductive material 1304, etc. comprise copper. According to some embodiments, the first lower conductive material 1300, the second lower conductive material 1302, the third lower conductive material 1304, etc. are applied concurrently.

According to some embodiments, a layer 1306 of a lower conductive material is formed under the first conductive pillar 500, the second conductive pillar 506, the third conductive pillar 512, etc. and the lower insulating layer 1200. According to some embodiments, the layer 1306 of the lower conductive material is formed using a spin-on process, a deposition process, an injection process, a growth process, a sputtering process, etc. In some embodiments, an electroplating process is used to form the layer 1306 of the lower conductive material. According to some embodiments, a titanium seed layer is initially applied as part of the electroplating process. In some embodiments, the layer 1306 of the lower conductive material comprises copper. According to some embodiments, rather than filling the lower insulating openings with lower conductive materials, as previously described, the lower insulating openings are filled during the formation of the layer 1306 of the lower conductive material.

Figure 14A:
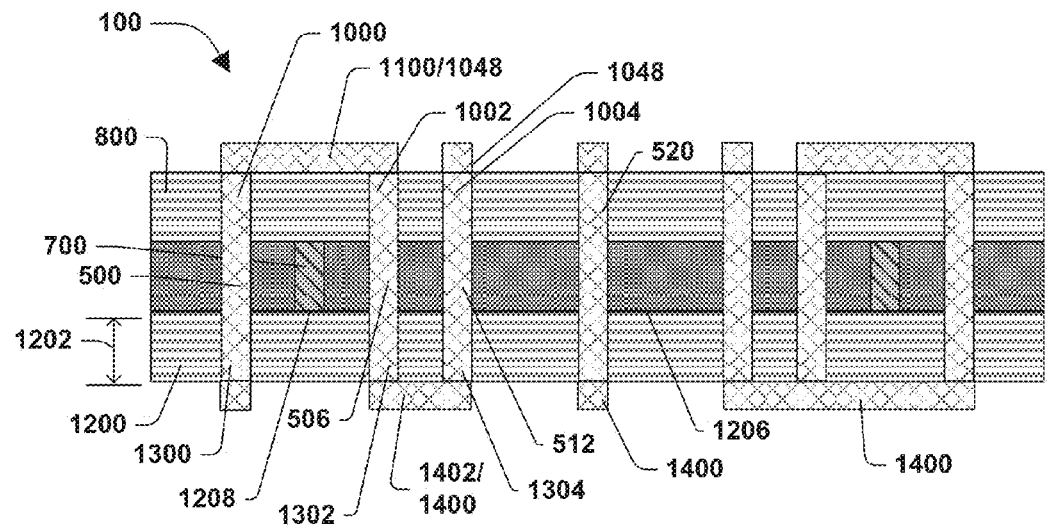
FIG. 14A illustrates forming one or more lower interconnects, according to some embodiments.
Figure 14B:
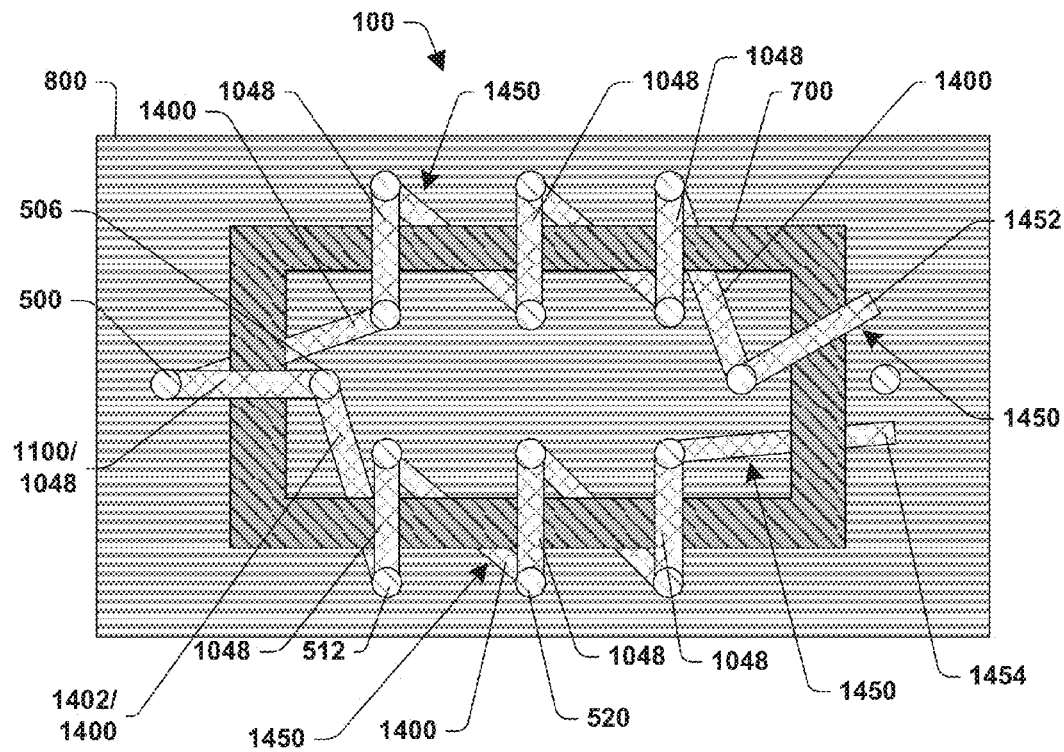
FIG. 14B illustrates forming one or more lower interconnects, according to some embodiments.

Turning to FIGS. 14A and 14B, according to some embodiments, the layer 1306 of the lower conductive material is patterned to form one or more lower interconnects 1400. In some embodiments, a first lower interconnect 1402 is formed below the magnetic structure 700. In some embodiments, the first lower interconnect 1402 connects the second conductive pillar 506 and the third conductive pillar 512, providing an electrically conductive pathway between the second conductive pillar 506 and the third conductive pillar 512. According to some embodiments, the layer 1306 of the lower conductive material is patterned using photolithography, dry etching, wet etching, plasma etching, etc. to form the lower interconnects 1400. According to some embodiments, the lower interconnects are formed concurrently.

As illustrated in FIG. 14B, the upper interconnects and the lower interconnects electrically connect conductive pillars that are on opposing sides of the magnetic structure 700 to form a conductive trace 1450 around the magnetic structure 700, where the conductive trace 1450 around the magnetic structure 700 forms the inductor 100. In some embodiments, the first upper interconnect 1100 electrically connects the first conductive pillar 500, which is located on an exterior side of the magnetic structure 700, and the second conductive pillar 506, which is located on an interior side of the magnetic structure 700, and the first lower interconnect 1402 electrically connects the second conductive pillar 506 and the third conductive pillar 512, which is located on the exterior side of the magnetic structure 700. According to some embodiments, the conductive trace 1450 is disconnected at a location to define a first end 1452 and a second end 1454 of the conductive trace 1450. According to some embodiments, a current source, a voltage source, an active device, etc. are applied to at least one of the first end or the second end.

Figure 15:
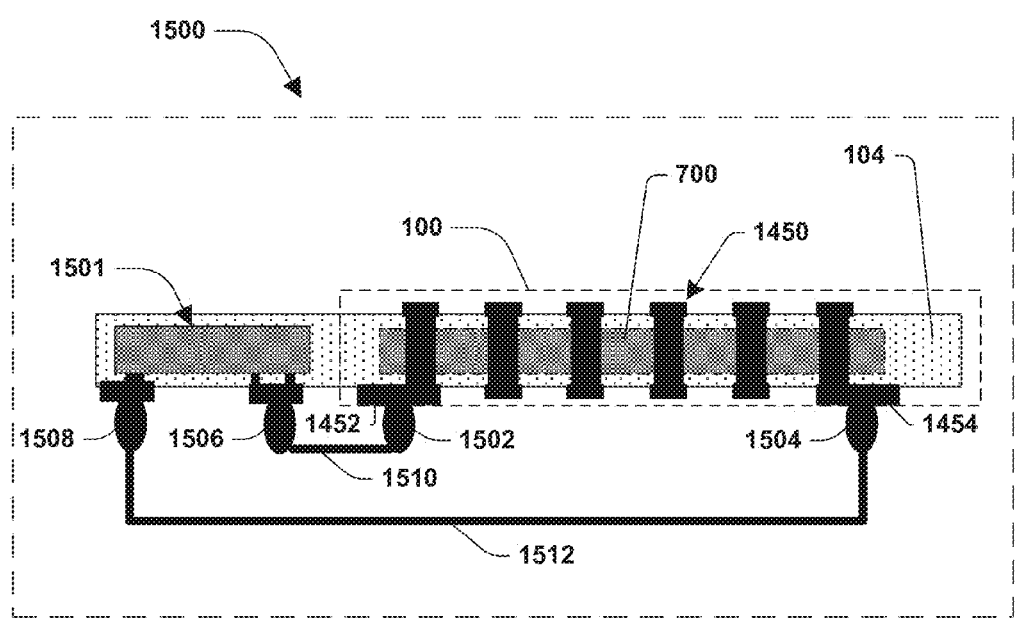
FIG. 15 illustrates an integrated circuit package, according to some embodiments.

Turning to FIG. 15, an integrated circuit package 1500 is illustrated according to some embodiments. According to some embodiments, the integrated circuit package 1500 comprises the inductor 100 and an active device 1501. In some embodiments, the inductor 100 is connected to one or more active devices, such as integrated circuits, within the integrated circuit package 1500. According to some embodiments, the active device 1501 comprises an integrated circuit, such as a power managed integrated circuit.

In some embodiments, the inductor 100 is electrically connected to the active device 1501 via one or more conductive mounts and connections. In some embodiments, a first conductive mount 1502 is electrically connected to the first end 1452 of the conductive trace 1450. In some embodiments, a second conductive mount 1504 is electrically connected to the second end 1454 of the conductive trace 1450. In some embodiments, a third conductive mount 1506 is electrically connected to the active device 1501 at a first position. In some embodiments, a fourth conductive mount 1508 is electrically connected to the active device 1501 at a second position.

According to some embodiments, a first connection 1510 electrically connects the first conductive mount 1502 and the third conductive mount 1506. According to some embodiments, a second connection 1512 electrically connects the second conductive mount 1504 and the fourth conductive mount 1508. In some embodiments, the inductor 100 provides various types of functionality for the active device 1501 through at least one of the first connection 1510 or the second connection 1512. In some embodiments, the inductor 100 functions as a transformer configured to step up or step down voltage to the active device 1501.

Figure 16:
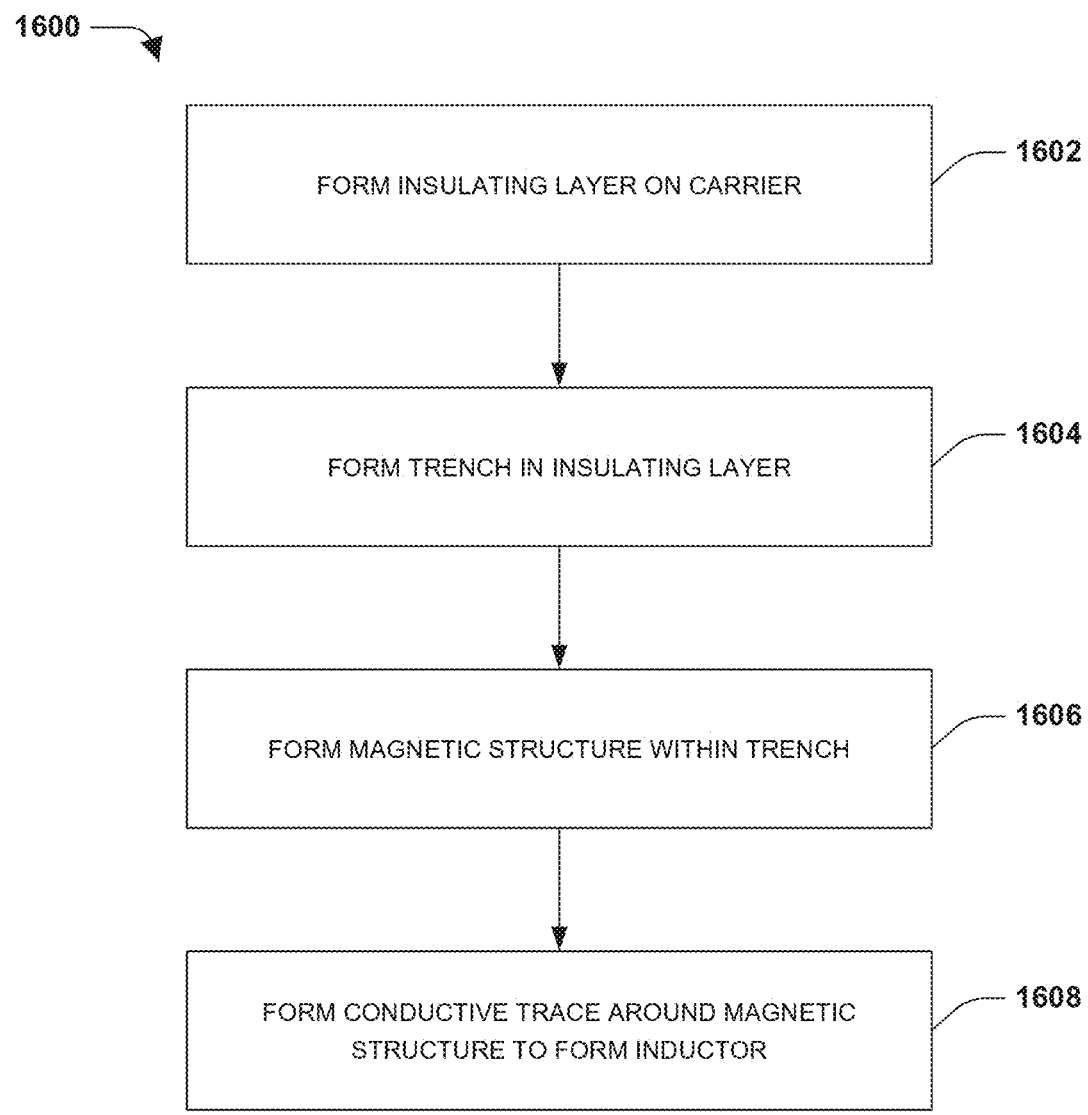
FIG. 16 illustrates a method for forming an inductor, according to some embodiments.

Turning to FIG. 16, according to some embodiments, a method 1600 for forming an inductor 100 is provided. At 1602, the method 1600 comprises forming an insulating layer 104 on a carrier 102. At 1604, the method 1600 comprises forming a trench 214 in the insulating layer 104. At 1606, the method 1600 comprises forming a magnetic structure 700 within the trench 214. At 1608, the method 1600 comprises forming a conductive trace 1450 around the magnetic structure 700 to form the inductor 100.

According to some embodiments, a small inductor suitable for incorporation into an integrated circuit package along with one or more active devices is efficiently and inexpensively produced. According to some embodiments, a single mask is used to concurrently form openings and a trench in fabricating the inductor, which reduces costs and fabrication time.

According to some embodiments, a method for forming an inductor comprises forming an insulating layer on a temporary carrier. In some embodiments, the method comprises forming a trench in the insulating layer. In some embodiments, the method comprises forming a magnetic structure within the trench. In some embodiments, the method comprises forming a conductive trace around the magnetic structure to form an inductor.

According to some embodiments, a method for forming an inductor comprises forming a first opening, a second opening, a third opening, and a trench in an insulating layer. In some embodiments, the method comprises forming a first filler structure by filling the first opening with a first filler material. In some embodiments, the method comprises forming a second filler structure by filling the second opening with a second filler material. In some embodiments, the method comprises forming a third filler structure by filling the third opening with a third filler material. In some embodiments, the method comprises forming a trench filler structure by filling the trench with a trench filler material. In some embodiments, the method comprises removing the first filler structure from the first opening, the second filler structure from the second opening, and the third filler structure from the third opening. In some embodiments, the method comprises forming a first conductive pillar by filling the first opening with a first conductive material. In some embodiments, the method comprises forming a second conductive pillar by filling the second opening with a second conductive material. In some embodiments, the method comprises forming a third conductive pillar by filling the third opening with a third conductive material. In some embodiments, the method comprises removing the trench filler structure from the trench. In some embodiments, the method comprises forming a magnetic structure by filling the trench with a magnetic material. In some embodiments, the method comprises forming a first upper interconnect positioned above the magnetic structure and connecting the first conductive pillar and the second conductive pillar. In some embodiments, the method comprises forming a first lower interconnect positioned below the magnetic structure and connecting the second conductive pillar and the third conductive pillar, the first conductive pillar, the first upper interconnect, the second conductive pillar, the first lower interconnect, and the third conductive pillar forming a conductive trace around the magnetic structure to form an inductor.

According to some embodiments, a method for forming an inductor comprises forming a first opening and a trench in an insulating layer. In some embodiments, the method comprises forming a first filler structure by filling the first opening with a first filler material. In some embodiments, the method comprises forming a trench filler structure by filling the trench with a trench filler material. In some embodiments, the method comprises removing the first filler structure from the first opening. In some embodiments, the method comprises forming a first conductive pillar by filling the first opening with a first conductive material. In some embodiments, the method comprises removing the trench filler structure from the trench. In some embodiments, the method comprises forming a magnetic structure by filling the trench with a magnetic material. In some embodiments, the method comprises forming a conductive trace around the magnetic structure to form an inductor, the conductive trace comprising the first conductive pillar.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

It will be appreciated that layers, features, elements, etc. depicted herein are illustrated with particular dimensions relative to one another, such as structural dimensions or orientations for purposes of simplicity and ease of understanding and that actual dimensions of the same differ substantially from that illustrated herein, in some embodiments. Additionally, a variety of techniques exist for forming the layers features, elements, etc. mentioned herein, such as electrochemical plating (ECP), etching techniques, wet remove techniques, implanting techniques, doping techniques, spin-on techniques, sputtering techniques such as magnetron or ion beam sputtering, growth techniques, such as thermal growth, or deposition techniques such as chemical vapor deposition (CVD), atomic layer deposition (ALD, physical vapor deposition (PVD), etc.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A method for forming an inductor, the method comprising:
    forming an insulating layer on a first carrier;
    forming a trench in the insulating layer, wherein:
        an uppermost surface of the first carrier interfaces with the insulating layer, and
        the uppermost surface of the first carrier defines a bottom of the trench;
    forming a magnetic structure within the trench;
    forming a conductive trace around the magnetic structure to form an inductor; and
    electrically coupling the conductive trace to an active device having a top surface disposed under the insulating layer and a bottom surface disposed over the insulating layer.

2. The method of claim 1, wherein the uppermost surface of the first carrier interfaces with the insulating layer at a first interface lying in a first plane and the bottom of the trench lies in the first plane.

3. The method of claim 1, comprising:
    forming an upper insulating layer on an upper insulating surface of the insulating layer and an upper magnetic surface of the magnetic structure; and
    forming a lower insulating layer on a lower insulating surface of the insulating layer and a lower magnetic surface of the magnetic structure.

4. The method of claim 1, comprising:
    forming a first opening in the insulating layer concurrently with the forming a trench in the insulating layer;
    forming a first filler structure by filling the first opening with a first filler material; and
    forming a trench filler structure by filling the trench with a trench filler material different than the first filler material.

5. The method of claim 4, the forming a conductive trace comprising:
    removing the first filler structure from the first opening without removing the trench filler structure from the trench; and
    forming a first conductive pillar by filling the first opening with a first conductive material, wherein the first conductive pillar is part of the conductive trace.

6. The method of claim 5, the forming a magnetic structure comprising:
    removing the trench filler structure from the trench without removing the first conductive pillar from the first opening; and
    filling the trench with a magnetic material.

7. A method for forming an inductor, the method comprising:
    forming a first opening, a second opening, a third opening, and a trench in an insulating layer, wherein the second opening exposes an uppermost surface of a first carrier interfacing with the insulating layer;
    forming a first filler structure by filling the first opening with a first filler material;
    forming a second filler structure by filling the second opening with a second filler material;
    forming a third filler structure by filling the third opening with a third filler material;
    forming a trench filler structure by filling the trench with a trench filler material, wherein the trench filler material is different than at least one of the first filler material, the second filler material, or the third filler material;
    removing the first filler structure from the first opening, the second filler structure from the second opening, and the third filler structure from the third opening after the forming a trench filler structure;
    forming a first conductive pillar by filling the first opening with a first conductive material;
    forming a second conductive pillar by filling the second opening with a second conductive material;
    forming a third conductive pillar by filling the third opening with a third conductive material;
    removing the trench filler structure from the trench;
    forming a magnetic structure by filling the trench with a magnetic material;
    forming a first upper interconnect positioned above the magnetic structure and connecting the first conductive pillar and the second conductive pillar; and
    forming a first lower interconnect positioned below the magnetic structure and connecting the second conductive pillar and the third conductive pillar, wherein the first conductive pillar, the first upper interconnect, the second conductive pillar, the first lower interconnect, and the third conductive pillar form a conductive trace around the magnetic structure to form an inductor.

8. The method of claim 7, comprising, prior to the forming a first upper interconnect:
    forming an upper insulating layer above the insulating layer, the first conductive pillar, the second conductive pillar, the third conductive pillar, and the magnetic structure.

9. The method of claim 8, comprising:
    forming a first upper insulating opening in the upper insulating layer to expose the first conductive pillar; and
    forming a second upper insulating opening in the upper insulating layer to expose the second conductive pillar.

10. The method of claim 9, wherein:
    the forming a first conductive pillar comprises filling the first upper insulating opening with a first upper conductive material; and
    the forming a second conductive pillar comprises filling the second upper insulating opening with a second upper conductive material.

11. The method of claim 10, the forming a first upper interconnect comprising:

forming a layer of an upper conductive material over the first conductive pillar, the second conductive pillar, and the upper insulating layer; and patterning the layer of the upper conductive material to establish the first upper interconnect between the first conductive pillar and the second conductive pillar.

12. The method of claim 7, comprising, prior to the forming a first lower interconnect:

removing the first carrier; and forming a lower insulating layer below the insulating layer, the first conductive pillar, the second conductive pillar, the third conductive pillar, and the magnetic structure.

13. The method of claim 12, comprising:

forming a second lower insulating opening in the lower insulating layer to expose the second conductive pillar; and forming a third lower insulating opening in the lower insulating layer to expose the third conductive pillar.

14. The method of claim 13, wherein:

the forming a second conductive pillar comprises filling the second lower insulating opening with a second lower conductive material; and the forming a third conductive pillar comprises filling the third lower insulating opening with a third lower conductive material.

15. The method of claim 14, the forming a first lower interconnect comprising:

forming a layer of a lower conductive material below the second conductive pillar, the third conductive pillar, and the lower insulating layer; and patterning the layer of the lower conductive material to establish the first lower interconnect between the second conductive pillar and the third conductive pillar.

16. A method for forming an inductor, the method comprising:

forming a first opening and a trench in an insulating layer to expose an uppermost surface of a first carrier through the first opening;

forming a first filler structure by filling the first opening with a first filler material;

forming a trench filler structure by filling the trench with a trench filler material;

removing the first filler structure from the first opening;

forming a first conductive pillar by filling the first opening with a first conductive material;

removing the trench filler structure from the trench;

forming a magnetic structure by filling the trench with a magnetic material, wherein a width of the magnetic structure is greater than or equal to a width of the first conductive pillar; and forming a conductive trace around the magnetic structure to form an inductor, the conductive trace comprising the first conductive pillar.

17. The method of claim 16, comprising:

forming an upper insulating layer above the insulating layer, the first conductive pillar, and the magnetic structure; and forming a lower insulating layer below the insulating layer, the first conductive pillar, and the magnetic structure.

18. The method of claim 17, comprising:

forming a first upper insulating opening in the upper insulating layer to expose the first conductive pillar; and forming a first lower insulating opening in the lower insulating layer to expose the first conductive pillar.

19. The method of claim 18, the forming a first conductive pillar comprising:

filling the first upper insulating opening with a first upper conductive material; and filling the first lower insulating opening with a first lower conductive material.

20. The method of claim 2, the forming a conductive trace comprising:

forming a first opening in the insulating layer, wherein a bottom of the first opening lies in the first plane.

* * * * *